United States Patent
Yano et al.

(10) Patent No.: US 8,598,578 B2
(45) Date of Patent: Dec. 3, 2013

(54) SPUTTERING TARGET AND THIN FILM TRANSISTOR EQUIPPED WITH SAME

(75) Inventors: Koki Yano, Sodegaura (JP); Masayuki Itose, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 13/510,934

(22) PCT Filed: Nov. 18, 2010

(86) PCT No.: PCT/JP2010/006765
§ 371 (c)(1),
(2), (4) Date: May 18, 2012

(87) PCT Pub. No.: WO2011/061939
PCT Pub. Date: May 26, 2011

(65) Prior Publication Data
US 2012/0228608 A1   Sep. 13, 2012

(30) Foreign Application Priority Data
Nov. 19, 2009 (JP) ................................. 2009-264307

(51) Int. Cl.
*H01L 29/12* (2006.01)
(52) U.S. Cl.
USPC .......... 257/43; 438/104; 252/500; 252/520.2; 204/192.15
(58) Field of Classification Search
USPC ......... 257/43, 57, E29.296, E21.09, E29.095; 438/104, 487, 585, 779, 796
See application file for complete search history.

(56) References Cited

U.S. PATENT DOCUMENTS

| | | | |
|---|---|---|---|
| 8,129,719 B2 * | 3/2012 | Yamazaki et al. | 257/43 |
| 8,148,245 B2 * | 4/2012 | Ikisawa et al. | 438/482 |
| 8,193,045 B2 * | 6/2012 | Omura et al. | 438/151 |
| 2007/0194379 A1 * | 8/2007 | Hosono et al. | 257/347 |
| 2008/0296567 A1 * | 12/2008 | Irving et al. | 257/43 |
| 2010/0108502 A1 | 5/2010 | Inoue et al. | |
| 2010/0140611 A1 * | 6/2010 | Itagaki et al. | 257/43 |
| 2010/0276685 A1 * | 11/2010 | Itagaki et al. | 257/43 |
| 2010/0289020 A1 | 11/2010 | Yano et al. | |
| 2010/0320458 A1 | 12/2010 | Umeda et al. | |
| 2010/0320459 A1 | 12/2010 | Umeda et al. | |
| 2011/0084280 A1 * | 4/2011 | Nakayama et al. | 257/59 |
| 2011/0306165 A1 * | 12/2011 | Ikisawa et al. | 438/104 |
| 2011/0315936 A1 * | 12/2011 | Inoue et al. | 252/512 |

FOREIGN PATENT DOCUMENTS

| | | |
|---|---|---|
| JP | 2007-073312 | 3/2007 |
| JP | 2007-223849 | 9/2007 |
| JP | 4415062 | 2/2010 |
| JP | 4571221 | 10/2010 |
| WO | WO 2008/072486 A1 | 6/2008 |

(Continued)

OTHER PUBLICATIONS

Toshihiro Moriga et al., "Electrical and Optical Properties of Transparent Conducting Homologous Compounds in the Indium-Gallium-Zinc Oxide System", Journal of the American Ceramic Society, 1999, vol. 82, No. 10.*

(Continued)

*Primary Examiner* — Eva Yan Montalvo
(74) *Attorney, Agent, or Firm* — Foley & Lardner LLP

(57) ABSTRACT

A sintered body including an oxide that includes In, Ga and Zn at the following atomic ratio and includes a compound having as a main component a homologous crystal structure represented by $InGaO_3(ZnO)$:

$0.28 \leq Zn/(In+Zn+Ga) \leq 0.38$ $0.18 \leq Ga/(In+Zn+Ga) \leq 0.28$.

9 Claims, 3 Drawing Sheets

(56) References Cited

FOREIGN PATENT DOCUMENTS

WO WO 2009/075281 A1 6/2009
WO WO 2009/084537 7/2009

OTHER PUBLICATIONS

International Preliminary Report on Patentability PCT/JP2010/006765 dated Jun. 12, 2012.

International Search Report PCT/JP2010/006765 dated Feb. 22, 2011.

Toshihiro Moriga et al., "Electrical and Optical Properties of Transparent Conducting Homologous Compounds in the Indium-Gallium-Zinc Oxide System", J. Am. Ceram. Soc., 1999, 82, pp. 2705-2710.

Masaki Nakamura et al., "The Phase Relations in the $In_2O_3$-$Ga_2ZnO_4$-ZnO System at 1350° C", Journal of Solid State Chemistry vol. 93, No. 1, 298-315 (1991).

* cited by examiner

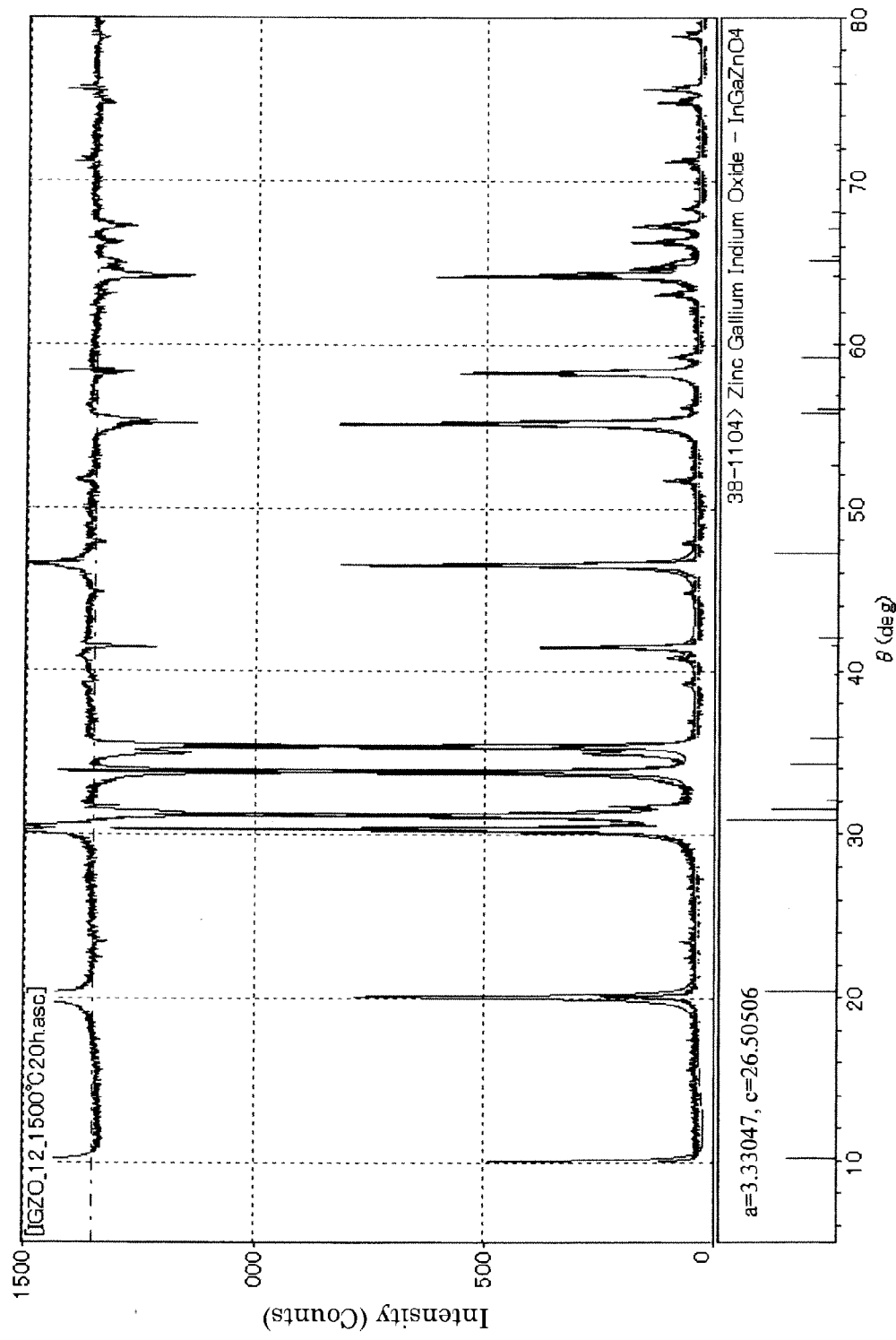

SPUTTERING TARGET AND THIN FILM TRANSISTOR EQUIPPED WITH SAME

TECHNICAL FIELD

The invention relates to a sintered a sputtering target, a thin film transistor using the same and a method for producing the same. In particular, the invention relates to a sintered body formed of an oxide comprising as a main component a compound having a homologous crystal structure represented by $InGaO_3(ZnO)$.

BACKGROUND ART

An amorphous oxide film composed of indium oxide and zinc oxide or composed of indium oxide, zinc oxide and gallium oxide have transparency to visible rays, and has a wide variety of electric properties as a conductor, a semiconductor or an insulator. Therefore, such an amorphous film has attracted attention as a semiconductor film used in a transparent conductor film, a thin film transistor or the like.

As the method for forming this oxide film, a physical film-forming method such as sputtering, PLD (pulse laser deposition) and deposition or a chemical film-forming method such as the sol-gel method has been studied. A physical film-forming method such as the sputtering method has been mainly studied since it is a method which can form a film in a large area at relatively low temperatures.

In order to form an oxide thin film by a physical film-forming method such as sputtering, in order to form a homogenous film stably and efficiently (at a high film-forming speed), a target formed of an oxide sintered body is generally used.

As the target (sputtering target) for forming an oxide film (conductive film/semiconductor film, ordinary amorphous film) composed of indium oxide, zinc oxide and gallium oxide various targets have been proposed.

For example, in Patent Document 1, studies have been made on a production method in which a highly insulating $Ga_2O_3$ crystal phase is not generated in an In—Ga—Zn—O sintered body.

Patent Document 2 discloses a target which is composed mainly of a homologous structure represented by $InGaZnO_4$ ($InGaO_3(ZnO)$) (i.e. an XRD peak derived from other metal oxides is not observed) and has an atomic ratio of In, Ga and Zn is 1:1:1.

Patent Document 3 discloses a polycrystalline oxide target containing a homologous structure represented by $InGaZnO_4$ ($InGaO_3(ZnO)$).

In particular, a target formed of a single crystal form (a target in which an XRD peak derived from other metal oxides is not observed) has been desired. It is because a target formed of a single crystal form is expected to have advantages that quality control is easy, abnormal discharge occurs less frequently, deviation in composition ratio between the target and the thin film is small, a strong film can be easily formed, or the like.

However, in order to produce a target formed of a single crystal form (a target in which an XRD peak derived from other metal oxides is not observed in an X-ray diffraction), it is believed that an atomic ratio of In and Ga of 1:1 is required. Therefore, studies were made on a target in which the atomic ratio of In and Ga is 1:1 (for example, the atomic ratio of In, Ga and Zn is 1:1:1, 2:2:1 or the like).

In studies using these targets, with a progress in studies for mass-production, problems that the film thickness varies according to a slight distribution of plasma density at the time of sputtering, the film thickness varies according to a slight variation in oxygen partial pressure between batches or the like have come up to the surface. The reason therefor is assumed to be as follows. Since the bonding power with oxygen is too strong, when an attempt is made to form a film having a carrier density suited to semiconductor applications, it was necessary to form a film at a film-forming speed which is sensitive to a variation in oxygen partial pressure or the like. The reason therefor is assumed to be well-balanced atomic ratio of In and Ga and an excessive amount of Ga in these targets.

On the other hand, even in the case of a target in which the atomic ratio of In, Ga and Zn is 1:1:1, it was difficult to produce a target formed of a single crystal form. As shown in Patent Document 1, in order to suppress the generation of a crystal form such as $Ga_2O_3$, many restrictions are imposed on the manufacturing conditions. Further, there are many cases that, in a crystal which is judged to be a single crystal, other crystal peaks are observed when observation is made in detail. For example, an invented product A of Patent Document 3 has a relatively low density. However, FIG. 5 shows that this product A has a peak which is not attributed to $InGaZnO_4$ in a range of 2θ of 62.0 to 62.6 degrees in X-ray diffraction. Further, as shown in Comparative Example 2 of Patent Document 1 and in Comparative Example 1 of Patent Document 2, a problem may tend to arise that a target having a single crystal form, even if it is produced, has a low density, a high resistance or the like.

On the other hand, Patent Document 4 discloses an In—Ga—Zn—O target with a composition in which the Ga content is small. However, studies on the production method or the properties of the target are not insufficient, and the resistance of the target disclosed in this document is high. Therefore, studies on production of a target formed of a single crystal form with a composition ratio having a low Ga content have not been made.

Studies on the synthesis of various crystal forms using oxide powder were made (Non-Patent Document 1). However, no studies were made on a sputtering target which is formed by sintering a shaped body. Further, no attempts were made to prepare a thin film transistor.

RELATED ART DOCUMENT

Patent Documents

Patent Document 1: JP-A-2007-223849
Patent Document 2: JP-A-2008-214697
Patent Document 3: JP-A-2007-73312
Patent Document 4: WO09/075281

Non-Patent Documents

M. Nakamura, N. Kimizuka and T. Mohri, J. Solid State Chem. Vo. 93, Ed. 2, Page 298, 1991

SUMMARY OF THE INVENTION

An object of the invention is to provide a sintered body which can be used in a sputtering target having a single crystal structure as a main component in a range in which the Ga content is smaller than the In content.

The inventors made intensive studies. As a result, the inventors have found that, in a prescribed composition region, a sputtering target containing a compound having a lower Ga content than the In content and having a homologous crystal structure represented by $InGaO_3(ZnO)$ as a main component can be obtained. Further, the inventors have found that, by using this target, a film having a carrier density suited for use in a semiconductor (a carrier density range which is preferable in semiconductor applications is $1\times10^{15}$ to $1\times10^{19}$ cm$^{-3}$, more preferably $1\times10^{16}$ to $5\times10^{18}$ cm$^{-3}$, with $1\times10^{17}$ to $1\times10^{18}$ cm$^{-3}$ being particularly preferable) can be formed at a stable film-forming speed.

According to the invention, the following sintered body, the sputtering target, or the like are provided.

1. A sintered body comprising an oxide that comprises In, Ga and Zn at the following atomic ratio and comprises as a main component a compound having a homologous crystal structure represented by InGaO$_3$(ZnO):

$$0.28 \leq Zn/(In+Zn+Ga) \leq 0.38$$

$$0.18 \leq Ga/(In+Zn+Ga) \leq 0.28.$$

2. The sintered body according to 1, wherein crystals of compounds represented by Ga$_2$O$_3$, ZnGa$_2$O$_4$, ZnO, In$_2$O$_3$, InGaO$_3$ and In$_2$O$_3$(ZnO)$_3$ are not observed in an analysis by X-ray diffraction.

3. The sintered body according to 1 or 2, wherein the atomic ratio of In, Ga and Zn of the oxide further satisfies the following formula:

$$0.59 \leq In/(In+Ga).$$

4. The sintered body according to any of 1 to 3, wherein the oxide consists essentially of In, Ga, Zn and O.

5. A sputtering target comprising the sintered body according to any of 1 to 4.

6. The sputtering target according to 5 which has a relative density of 90% or more, a specific resistance of 15 mΩcm or less, a surface roughness of 2 μm or less and an average crystal diameter of 10 μm or less.

7. A method for producing a thin film transistor comprising the step of forming a semiconductor layer using the sputtering target according to 5 or 6.

8. A thin film transistor prepared by using the sputtering target according to 5 or 6.

According to the invention, a sintered body and a sputtering target which are hardly broken and can realize stable sputtering due to the presence of a single crystal structure as a main component in a region having a low Ga content.

By using the sputtering target of the invention, the film-forming speed is hardly affected by variations or the like of the oxygen partial pressure at the time of sputtering, and as a result, it is expected that a film having a carrier density suited to semiconductor applications can be formed at a stable film-forming speed. Further, since the sputtering target of the invention has a low Ga content, control of oxygen deficiency is facilitated, whereby the carrier density of a thin film after sputtering can be stably controlled.

BRIEF DESCRIPTION OF THE DRAWINGS

FIG. 3 is a view showing the result of an X-ray diffraction measurement of the sintered body prepared in Example 3.

MODE FOR CARRYING OUT THE INVENTION

Figure 1:
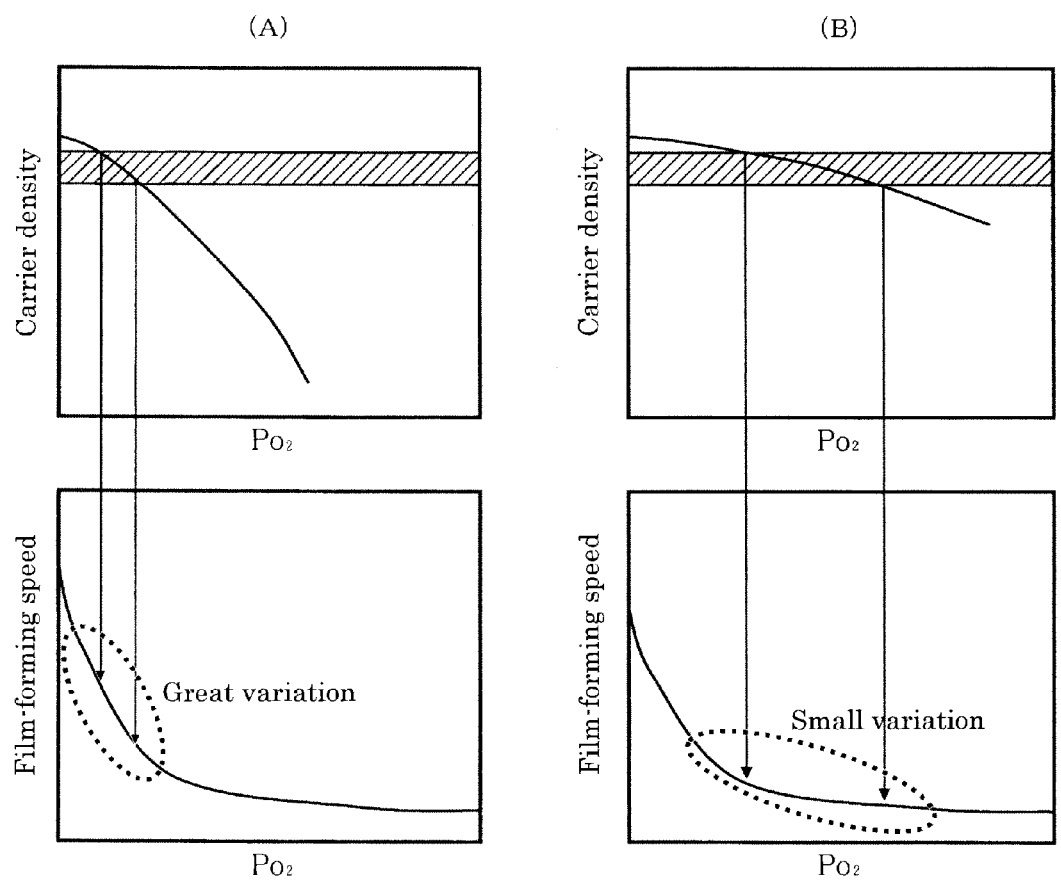
FIG. 1 is a schematic view showing the relationship between the oxygen partial pressure and carrier density/film-forming speed at the time of film formation by sputtering.

The sintered body of the invention is formed of an oxide comprising In, Ga and Zn in the following atomic ratio. This oxide contains, as a main component, a compound having a homologous crystal structure represented by InGaO$_3$(ZnO). The sintered body of the invention can be used as a suttering target.

$$0.28 \leq Zn/(In+Zn+Ga) \leq 0.38$$

$$0.18 \leq Ga/(In+Zn+Ga) \leq 0.28.$$

If the atomic ratio is in the above-mentioned range, advantageous effects that generation of crystal structures other than the homologous crystal structure represented by InGaO$_3$(ZnO) is suppressed, difference between the properties of the crystal form between the surface of the target and the inside of the target becomes small, the composition ratio of In and Ga of the target is reflected to the semiconductor film or the like are expected.

If the ratio Zn/(In+Zn+Ga) is 0.38 or less, the average transverse rupture strength of the target is expected to be improved. If the ratio exceeds 0.38, other crystal structures may be generated in the inside of the target. If the ratio is 0.28 or more, the relative density of the target is expected to be improved and the specific resistance of the target is expected to be lowered.

If the ratio Ga(In+Zn+Ga) is 0.28 or less, the mobility can be improved and the S value can be decreased. In addition, a film having a carrier density suited to semiconductor applications can be formed at a stable film-forming speed. If the ratio is less than 0.18, other crystal structures may be generated inside the target.

The atomic ratio is more preferably, $$0.30 \leq Zn/(In+Zn+Ga) \leq 0.36$$

$$0.19 \leq Ga/(In+Zn+Ga) \leq 0.28, \text{ and}$$

particularly preferably $$0.34 \leq Zn/(In+Zn+Ga) \leq 0.36$$

$$0.20 \leq Ga/(In+Zn+Ga) \leq 0.27$$

The "comprises as a main component the homologous crystal structure represented by InGaO$_3$(ZnO)" generally means that "in the X-ray diffraction, the total of peak areas attributed to the homologous crystal structure represented by InGaO$_3$(ZnO) accounts for 90% or more of the total area of the peaks". The total of the peak area attributed to the homologous crystal structure represented by InGaO$_3$(ZnO) is more preferably 95% or more, further preferably 98% or more, with 99% or more being particularly preferable. The upper limit is 100%.

In the X-ray diffraction, the peak showing the crystals of the compound represented by Ga$_2$O$_3$, ZnGa$_2$O$_4$, ZnO, In$_2$O$_3$, InGaO$_3$, or In$_2$O$_3$(ZnO)$_3$ which is not attributed to a pattern showing the crystal structure represented by InGaO$_3$(ZnO) is preferably 5% or less of the maximum peak of InGaO$_3$(ZnO) (normally around 2θ=30.8 degrees), more preferably 3% or less, and further preferably 1% or less. Confirmation of no peaks is particularly preferable.

Further, it is most preferable that a peak attributed to a metal oxide other than InGaO$_3$(ZnO) is not confirmed.

Further, it is preferred that the "peak in the X-ray diffraction in the range of 2θ of 62.0 to 62.6 degrees (excluding a peak attributed to the homologous crystal structure represented by InGaO$_3$(ZnO) be 3% or less of the maximum peak of InGaO$_3$(ZnO)". The "peak in the X-ray diffraction in the range of 2θ of 62.0 to 62.6 is 3% or less of the maximum peak of InGaO$_3$(ZnO) means that the "peak in the X-ray diffraction in the range of 2θ of 62.0 to 62.6 degrees which is not attributed to a pattern showing the crystal structure represented by InGaO$_3$(ZnO) is 3% or less of the maximum peak (normally at around of 2θ of 30.8) of InGaO$_3$(ZnO)". Further, the peak in the range of 2θ of 62.0 to 62.6 degrees is more preferably 2% or less, further preferably 0.5% or less, with no peak confirmation being particularly preferable.

In MAP of the area analysis of the composition of In, Ga, Zn and O by EPMA, it is preferred that each element be uniformly dispersed.

The measurement conditions for X-ray diffraction are as follows, for example.

Apparatus: Ultima-Ill, manufactured by Rigaku Corporation

X rays: Cu-Kα rays (wavelength: 1.5406 Å, monochromized by means of a graphite monochrometer)

2θ-θ reflection method, continuous scanning (1.0°/min)

Sampling interval: 0.02°

Slit DS, SS: 2/3°, RS: 0.6 mm

The crystal form (crystal structure) can be specified by referring to JCPDS (Joint Committee of Powder Diffraction Standards) cards for the crystals registered in JCPDS cards. The homologous crystal structure represented by InGaO$_3$(ZnO) is shown in JCPDS card No. 38-1104.

The crystal form of InGaO$_3$(ZnO) may be described as InGaZnO$_4$.

If the structure is judged by the crystal structure X-ray diffraction pattern, the amount of oxygen may be excessive or insufficient (oxygen deficiency) (it may be in accordance with the stoichiometric ratio or may be deviated from the stoichiometric ratio). However, it is preferred that it have oxygen deficiency. If the amount of oxygen is excessive, the resistance may be too high if a target is formed by using this sintered body.

If the pattern obtained by the X-ray diffraction is the same (i.e. the structure is the same), the lattice constant obtained by the X-ray diffraction may be different from that shown in No. 38-1104 of the JCPDS card.

The lattice constant a obtained from the X-ray diffraction is normally 3.30 to 3.35, preferably 3.31 to 3.34, and particularly preferably 3.325 to 3.335.

The lattice constant c obtained from the X-ray diffraction is normally 26.00 to 26.70, preferably 26.30 to 26.60, with 26.45 to 26.55 being particularly preferable.

Within the above-mentioned range, if the Ga content is small, the homologous crystal structure represented by InGaO$_3$(ZnO) can be taken.

Similarly, if the pattern obtained by the X-ray diffraction is the same (i.e. the structure is the same), the peak position may be different from that shown in No. 38-1104 of the JCPDS card. It is particularly preferred that the peak position be shifted to the lower angle side. Shifting to the lower angle side is assumed to be caused by solid solution of In in the Ga site of InGaO$_3$(ZnO), insertion of atoms between lattices or the like. The shifting of the peak position to the lower angle side is preferable since it is assumed that the occurrence of the above-mentioned state suppresses generation of crystals other than InGaO$_3$(ZnO).

It is further preferred that the atomic ratio of In, Ga and Zn of the oxide satisfy the following formula:

$$0.59 \leq In/(In+Ga)$$

Further, the atomic ratio particularly preferably satisfies the following formula:

$$0.60 \leq In/(In+Ga)$$

If the atomic ratio is within this range, the mobility can be improved and the S value can be decreased. Further, a film having a carrier density suited to semiconductor applications can be formed at a stable film-forming speed.

Further, it is preferred that the oxide essentially consists of In, Ga, Zn and O.

The "essentially consists of In, Ga, Zn and O" means that no elements are contained other than In, Ga, Zn and O and impurities which are inevitably mixed in from a raw material or during the production process or for other reasons. Normally, it means that the amount of impurities is 10 ppm or less. Assumed impurities include Fe, Ca, Cr, Pb and Cd.

By the above-mentioned configuration, the sputtering target of the invention can be used in a region which is not sensitive to a change in an oxygen partial pressure at the time of film formation by sputtering. As shown in FIG. 1(A), in the case of a sputtering target which is sensitive to an oxygen partial pressure, when an attempt is made to form a film having a carrier density suited to semiconductor applications, the carrier density varies greatly when the oxygen partial pressure is changed. Further, like the change in carrier density, the film-forming speed varies greatly. On the other hand, as shown in FIG. 1(B), in the case of a sputtering target which is not sensitive to oxygen partial pressure, when an attempt is made to form a film having a carrier density suited to semiconductor applications, the carrier density does not change greatly and the film-forming speed varies only slightly if the oxygen pressure varies. In FIG. 1, the part shown by slash lines is an appropriate range of the carrier density.

The sintered body and the sputtering target of the invention can be produced by a production method which comprises a mixing step, a pre-sintering step, a shaping step, a sintering step, a reduction step and a processing step. Each step will be explained hereinbelow.

The mixing step is a step in which metal oxides which are raw materials of the sputtering target are mixed.

As the raw material, powder of an indium compound, powder of a gallium compound and powder of a zinc compound are used. As the indium compound, indium oxide, indium hydroxide or the like can be given, for example. As the zinc compound, zinc oxide, zinc hydroxide or the like can be given, for example. As the gallium compound, gallium oxide, gallium hydroxide or the like can be given, for example. As for each compound, an oxide is preferable since sintering is easy and a bi-product is hardly remained.

The purity of a raw material is normally 2 N (99 mass %) or more, preferable 3 N or more (99.9 mass %), with 4 N (99.99 mass %) or more being particularly preferable. If the purity is lower than 2 N, durability may be lowered or burning may occur due to the mixing in of impurities in a liquid crystal when used in a liquid crystal display.

It is preferred that metal zinc (zinc powder) be used as part of the raw material. By using zinc powder as part of the raw material, generation of white spots can be suppressed.

It is preferred that the raw materials be compounded, and then uniformly mixed and pulverized by means of a normal pulverizer (a wet ball mill, a beads mill or an ultrasonic apparatus).

A pre-firing step is a step optionally provided in which a mixture of the compounds as the raw material of a sputtering target is pre-fired.

By the pre-firing step, although the density of the oxide can be easily increased, the production cost may also be increased. Therefore, it is more preferred that the density be increased without conducting pre-firing.

In the pre-firing step, it is preferred that the above-mentioned mixture be heat-treated at 500 to 1200° C. for 1 to 100 hours. It is more preferable to conduct a heat treatment at 800 to 1100° C. for 4 to 6 hours. If a heat treatment is conducted at less than 500° C. or for shorter than 1 hour, thermal decomposition of an indium compound, a zinc compound or a gallium compound may be insufficient. If the heat treatment is conducted at a temperature higher than 1200° C. or for longer than 100 hours, coarsening of particles may occur.

Therefore, it is particularly preferred that a heat treatment (pre-firing) be conducted at a temperature range of 800 to 1200° C. for 2 to 50 hours.

It is preferred that a pre-fired product obtained in this step be pulverized before the following shaping and firing steps. It is preferred that pulverization be conducted until the average particle size (D50) of the raw material powder becomes preferably 2 µm or less, more preferably 1 µm or less, and particularly preferably 0.5 µm or less.

Pulverization is conducted in order to allow the raw material to be dispersed uniformly. If raw material powder having a large particle size is present, non-uniformity in composition may occur in certain locations. Non-uniformity in composition in certain locations may cause abnormal discharge at the time of sputtering. Further, non-uniformity in composition may cause the composition of the target and the composition of the obtained thin film to be deviated.

A shaping step is a step in which the mixture obtained in the above-mentioned mixing step (the pre-fired product, if the above-mentioned pre-firing step is provided) is shaped under pressure, thereby to obtain a shaped product. By this step, the mixture or the pre-fired product is formed into a desired shape as a target. If the pre-firing step is provided, after granulating fine powder of the resulting pre-fired product, the granulated product can be press-shaped into a desired shape.

As the shaping treatment which can be used in this step, press shaping (uniaxial pressing), die shaping, cast molding, injection molding or the like can be mentioned, for example. In order to obtain a homogenous sintered body (target) having a high sintered density and a small specific resistance, it is preferable to conduct shaping by cold isostatic pressing (CIP), or the like.

Further, after press molding (uniaxial pressing), it is preferable to conduct cold isostatic pressing (CIP), hot isostatic pressing (HIP) or the like, i.e. to provide two or more steps of shaping, since reproducibility is enhanced.

When CIP (cold isostatic pressing or hydrostatic pressure apparatus) is used, it is preferable to hold at a surface pressure of 800 to 4000 kgf/cm$^2$ for 0.5 to 60 minutes, more preferable at a surface pressure of 2000 to 3000 kgf/cm$^2$ for 2 to 30 minutes. If the surface pressure and the holding time are within the above-mentioned range, it is expected that non-uniformity in composition inside the shaped body can be decreased, whereby uniformity can be obtained. Further, if the surface pressure is less than 800 kgf/cm$^2$, the density after sintering may not be increased or the resistance may be increased. If the surface pressure exceeds 4000 kgf/cm$^2$, the apparatus may become too large to cause an economical disadvantage. If the holding time is less than 0.5 minute, the density after sintering may not be increased or the resistance may become high. A holding time exceeding 60 minutes may be economically disadvantageous since a too long period of time is taken.

In the shaping, a shaping aid such as polyvinyl alcohol, methyl cellulose, polywax, oleic acid or the like may be used.

A sintering step is a step in which a shaped body obtained in the above-mentioned shaping step is fired.

As for the sintering conditions, it is preferred that sintering be conducted in an oxygen gas atmosphere or under an oxygen gas pressure. If sintering is conducted in an atmosphere which does not contain oxygen gas, the density of the resulting target cannot be increased sufficiently, whereby occurrence of abnormal discharge during sputtering may not be fully suppressed.

The sintering temperature is normally 1100° C. to 1600° C., more preferably 1350 to 1520° C., and particularly preferably 1400 to 1500° C. If the sintering is conducted at lower than 1100° C., the relative density may not be increased or the specific resistance may be increased. In addition, a crystal form other than the intended crystal form may tend to be generated. If sintering is conducted at higher than 1600° C. or higher, an element may be evaporated to cause the composition ratio to be deviated or the furnace to be damaged. In addition, an unintended crystal form may tend to be generated.

The sintering time is normally 1 to 96 hours, preferably 4 to 30 hours, further preferably 8 to 24 hours, with 10 to 20 hours being particularly preferable. If the sintering time is less than 1 hour, the relative density may not be increased and the specific resistance may be increased. In addition, an unintended crystal form may tend to be generated. If sintering is conducted for longer than 96 hours, productivity may be lowered. Further, an unintended crystal form may tend to be generated.

If sintering is conducted at 1350 to 1520° C. for 8 to 24 hours, a single crystal may be formed easily.

In addition, heating may be temporarily stopped during heating and holding is conducted at a holding temperature, whereby sintering is conducted in two or more steps.

The cooling rate during firing is normally 4° C./min or less, preferably 2° C./min or less, more preferably 1° C./min or less, further preferably 0.8° C./min or less, and particularly preferably 0.5° C./min or less. If the cooling rate is 4° C./min or less, the single crystal form of the invention can be easily obtained. Further, cracks hardly occur during the cooling.

A reduction step is a step which is optionally provided according to need in order to decrease the bulk resistance of the sintered body obtained in the above-mentioned sintering step in the entire target.

As for the reduction method which can be applied in this step, reduction using a reductive gas, reduction by vacuum firing, reduction with an inert gas or the like can be given.

In the case of a reduction treatment with a reductive gas, hydrogen, methane, carbon monoxide or a mixed gas with these gases and oxygen or the like can be used.

In the case of a reduction treatment by firing in an inert gas, nitrogen, argon, or a mixed gas with these gases and oxygen or the like can be used.

It is preferred that a reduction treatment (a heat treatment in an atmosphere of an inert gas such as argon and nitrogen, a hydrogen atmosphere or under vacuum or at a low pressure) be not conducted. If a reduction treatment is conducted, a difference in resistance value in a surface part and a deep part may be generated or amplified. If a difference in resistance value in a surface part and a deep part may be generated, the stability of the film-forming speed or the stability of the fabricated thin film transistor may be lowered. Since the target of the invention can have a low specific resistance without conducting a reduction treatment, normally no reduction treatment is required.

A processing step is a step which is provided according to need in order to cut the above-mentioned oxide sintered body obtained in the above-mentioned step into a shape which is suitable for mounting on a sputtering apparatus, as well as to provide a mounting jig such as a backing plate.

In order to form an oxide sintered body to be a sputtering target, the sintered body is ground by means of a plane grinder to allow the surface roughness Ra to be 5 µm or less. Further, the sputtering surface of the target may be subjected to mirror finishing, thereby allowing the average surface roughness thereof Ra to be 1000 Å or less. For this mirror finishing (polishing), known polishing techniques such as mechanical polishing, chemical polishing, mechano-chemical polishing (combination of mechanical polishing and chemical polishing) or the like may be used.

It is preferred that the grinding be conducted by 0.5 mm or more, more preferably 1 mm or more, and particularly preferably 2 mm or more. By grinding by 0.5 mm or more, a surface part in which the composition has been changed that is generated by evaporation of elements can be removed. A composition ratio which is the same from the surface to the inside is important in order to continuously produce a thin film transistor which has a high reproducibility or a high uniformity. In addition, if grinding is not conducted by 0.5 mm or more, a risk is high that an unintended crystal form is mixed in.

The surface roughness Ra of the target be 0.2 μm or less, more preferably 0.5 μm or less. It is preferred that the target surface be provided with a grinding surface having no directivity. If Ra is large or the grinding surface has directivity, abnormal discharge may occur or particles may be generated.

For example, it can be obtained by polishing by means of a fixed abrasive polisher (polishing liquid: water) to attain a roughness of #2000 or more, or can be obtained by a process in which, after lapping by a free abrasive lap (polisher: SiC paste or the like), lapping is conducted by changing the polisher into diamond paste as a polisher instead of the SiC paste. There are no specific restrictions on these polishing methods.

The thickness of the target is normally 2 to 20 mm, preferably 3 to 12 mm and particularly preferably 4 to 6 mm.

It is preferable to finish the surface of the target by means of a #200 to #10,000 diamond wheel, particularly preferably by means of a #400 to #5,000 diamond wheel. If a diamond wheel with a mesh size of smaller than #200 or a diamond wheel with a mesh size of larger than #10,000 is used, the target may be broken easily.

Subsequently, it is preferred that the thus processed sintered body be subjected to a cleaning treatment. For cleaning, air blowing, washing with running water or the like can be used. When foreign matters are removed by air blowing, foreign matters can be removed more effectively by air intake by means of a dust collector from the side opposite from the air blow nozzle.

Since the above-mentioned air blow or washing with running water has its limit, ultrasonic cleaning or the like can also be conducted. In ultrasonic cleaning, it is effective to conduct multiplex oscillation within a frequency range of 25 to 300 KHz. For example, it is preferable to perform ultrasonic cleaning a frequency range of 25 to 300 KHz by subjecting 12 kinds of frequency composed of every 25 KHz in a frequency range of 25 to 300 KHz to multiplex oscillation.

A sputtering target is obtained by bonding a target material to a backing plate. A plurality of target materials may be provided in a single backing plate to use as a substantially a single target.

The sputtering target preferably has a relative density of 90% or more, more preferably 94% or more, and particularly preferably 95% or more. If the relative density is 90% or more, abnormal discharge hardly occurs and sensitivity to oxygen partial pressure becomes stable. Further, if the relative density is 90% or more, the film-forming speed is increased, and stability of the film-forming speed is improved. In addition, deviation in composition ratio between the target and the obtained thin film becomes small. The specific resistance of the target is preferably 15 mΩcm or less, more preferably 8 mΩcm or less, and particularly preferably 5 mΩcm or less. If the resistance exceeds 15 mΩcm, cracks may occur in the target when DC sputtering is conducted. The average crystal size is preferably 10 μm or less, particularly preferably 5 μm or less. If the average crystal size is 10 μm or less, abnormal discharge hardly occurs.

The transverse rupture strength (average transverse rupture strength) of the target is preferably 58 MPa or more, more preferably 68 MPa or more, with 78 MPa or more being particularly preferable. If the transverse rupture strength (average transverse rupture strength) is 58 MPa or more, if a large-sized target is produced, breakage hardly occurs during the production or the use.

Meanwhile, since the single crystal form confirmed by the X-ray diffraction is contained as a main component, effects of increasing the transverse rupture strength (average rupture strength) can be expected. Further, increasing the sintering density, reducing the crystal particle size and decreasing the surface roughness are important to increase the transverse rupture strength.

The average diameter of the aggregated body of Ga atoms obtained by the surface analysis of each element by EPMA is preferably 10 μm or less, more preferably 5 μm or less, with 3 μm or less being particularly preferable.

Hereinbelow, the constitution and production method of a thin film transistor will be explained.

1. Substrate

No specific restrictions are imposed on the substrate, and known substrates in this technical field can be used. For example, glass substrates such as alkaline silicate glass, non-alkaline glass and quarts glass; a silicon substrate; resin substrates such as acryl substrates, polycarbonate substrates and polyethylene naphthalate (PEN); and polymer film substrates such as polyethylene terephthalate (PET) and polyamide.

2. Semiconductor Layer

As mentioned above, an oxide thin film obtained by sputtering by using the sputtering target of the invention is used. It is preferred that the semiconductor layer be an amorphous film. Due to the amorphous film, adhesiveness between an insulating film or a protective layer can be improved, whereby uniform transistor properties can be obtained easily even for a large area. Whether the semiconductor layer is amorphous or not can be confirmed by the X-ray crystal structure analysis. If no clear peak is observed, it is an amorphous film.

As for the composition ratio confirmed by ICP of a thin film prepared by sputtering the target, the difference in atomic ratio is preferably within ±3%, more preferably ±2%, and particularly preferably ±1%. If the difference in composition ratio of a thin film prepared by sputtering the target exceeds ±3%, problems that in-plane distribution of the composition ratio or thin film properties is increased, desired properties are not developed or the like may occur.

3. Protective Layer

No specific restrictions are imposed on the material for forming the protective layer. A material which is generally used can be arbitrarily selected as long as the advantageous effects of the invention are not impaired. For example, $SiO_2$, $SiN_x$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN, or the like may be used. Among these, it is preferable to use $SiO_2$, $SiN_x$, $Al_2O_3$, $Y_2O_3$, $Hf_2O_3$, or $CaHfO_3$, more preferably $SiO_2$, $SiN_x$, $Y_2O_3$, $Hf_2O_3$, or $CaHfO_3$, with oxides such as $SiO_2$, $Y_2O_3$, $Hf_2O_3$ and $CaHfO_3$ being particularly preferable. The number of oxygen atoms of these oxides need not necessarily coincide with the stoichiometric ratio (e.g., $SiO_2$ or $SiO_x$ may be used). $SiN_x$ may include hydrogen.

The protective layer may have a structure in which two or more different insulating films are stacked.

4. Gate Insulating Film

No specific restrictions are imposed on the material for forming the gate insulting layer. A material which is generally used can be arbitrarily selected. For example, $SiO_2$, $SiN_x$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN, or the like may be used. Among these, it is preferable to use $SiO_2$, $SiN_x$, $Al_2O_3$, $Y_2O_3$, $Hf_2O_3$, or $CaHfO_3$, more preferably $SiO_2$, $SiN_x$, $Y_2O_3$, $Hf_2O_3$, or $CaHfO_3$. The number of oxygen atoms of these oxides need not necessarily coincide with the stoichiometric ratio (e.g., $SiO_2$ or $SiO_x$ may be used). $SiN_x$ may include hydrogen.

The gate insulting film may have a structure in which two or more different insulating films are stacked.

The gate insulating film may be crystalline, polycrystalline, or amorphous. The gate insulating film is preferably polycrystalline or amorphous from the viewpoint of ease of industrial production.

The gate insulating film may be an organic insulating film (e.g., poly(4-vinylphenol) (PVP) or parylene). The gate insulating film may have a structure in which two or more layers of an inorganic insulating film and an organic insulating film are stacked.

The gate insulating layer may be formed by the sputtering method. However, it is preferred that the gate insulating layer be formed by a CVD method such as the TEOS-CVD method or the PECVD method. In the sputtering method, off current may be increased.

5. Electrode

No specific restrictions are imposed on the material forming each electrode such as a gate electrode, a source electrode and a drain electrode, and materials which are generally used can be arbitrarily selected.

For example, transparent electrodes such as indium tin oxide (ITO), indium zinc oxide, ZnO, $SnO_2$ or the like, a metal electrode such as Al, Ag, Cr, Ni, Mo, Au, Ti, Ta and Cu or an alloy containing these metals.

In the production of a thin film transistor (field effect transistor) and a thin film transistor panel, each constituting element (layer) can be formed by a method which is known in this technical field.

Specific examples of the film-forming method include a chemical film-forming method such as spraying, dipping and CVD or a physical film-forming method such as sputtering, vapor vacuum deposition, ion plating, or pulsed laser deposition. It is preferable to use a physical film-forming method since the carrier density can be easily controlled, and the quality of the film can be easily improved. It is more preferable to use sputtering due to high productivity.

The formed film can be patterned by various etching methods.

In the thin film transistor of the invention, it is preferred that the semiconductor layer be formed into a film by RF, DC or AC sputtering by using a target formed of the oxide sintered body of the invention. RF sputtering is preferable since a thin film for a thin film transistor can be prepared at a low oxygen partial pressure. DC or AC sputtering is preferable since a thin film transistor prepared by DC or AC sputtering can be used in a large apparatus and inexpensive facilities can be used.

In the thin film transistor of the invention, it is preferred that the semiconductor layer be subjected to a heat treatment at 70 to 350° C. Both the semiconductor layer and the protective layer for the semiconductor may be subjected to a heat treatment simultaneously. If the heat treatment temperature is lower than 70° C., heat stability or heat resistance of the resulting transistor may be lowered, the mobility may be lowered, the S value may be increased or the threshold voltage may be increased. If the heat treatment temperature is higher than 350° C., a substrate which does not have heat resistance cannot be used or equipment cost for a heat treatment may be incurred.

In the thin film transistor of the invention, it is preferred that the mobility be 10 $cm^2$/Vs or more, more preferably 11 $cm^2$/Vs or more, with 12 $cm^2$/V or more being particularly preferable. If the mobility is 10 $cm^2$/Vs or more, the switching speed may be increased and the transistor may tend to be applied to a large-sized and high-definition display. Further, advantages obtained by switching from amorphous silicon will be increased.

The S value is preferably 0.4V/decade or less, more preferably 0.3V/decade or less, with 0.2V/decade being particularly preferable. Although there are no limits on the lower limit, it is believed that the theoretical limit is around 0.06V/decade. If the S value is 0.4V/decade or less, difference in on-off switching voltage becomes small, whereby consumption power is expected to be lowered.

As for the driving state, normally-off is preferable. If driving is conducted in the normally-off state, driving can be conducted on a small consumption power.

EXAMPLES (1) Preparation of a Target (Sintered Body)

As a starting material, $In_2O_3$ (manufactured by Nippon Rare Metal, Inc: purity 4 N), $Ga_2O_3$ (manufactured by Nippon Rare Metal, Inc: purity 4 N) and ZnO (manufactured by Kojundo Chemical Laboratory Ca, Ltd.: purity 4 N) were used.

These raw materials were weighed and mixed by means of a ball mill for 24 hours. Thereafter, the mixture was granulated by natural drying. From the granulated product, a shaped product was obtained by CIP (cold isostatic pressing) under the conditions of a surface pressure of 2200 kgf/$cm^2$ and a holding time of 5 minutes. Sintering was conducted under the following conditions:

Heating rate: 1° C./min

Sintering temperature: 1500° C.

Sintering time: 12 hours

Sintering atmosphere: Oxygen

No heat treatment was conducted in reduction conditions. The sintered body with a thickness of 9 mm was ground and polished to a thickness of 5 mm. Further, the upper and lower surfaces and the corners were cut by means of a diamond cutter, and the surface was ground by a surface grinder to obtain a target having a surface roughness Ra of 0.5 µm or less. The surface was subjected to air blowing, and then ultrasonic cleaning for 3 minutes. Thereafter, the target material was bonded to a backing plate made of oxygen-free copper by means of indium solder, whereby a target was obtained. The target had a surface roughness of Ra≤□0.5 µm and a ground surface with no direction. The surface roughness was measured by means of a surface roughness meter.

(2) Evaluation of a Target

For the resulting sintered body for a target, the following evaluation was conducted. The results are shown in Table 1.

(a) Specific Resistance

Specific resistance was measured by the four probe method (JIS R1637) using a resistivity meter (Loresta, manufactured by Mitsubishi Chemical Corporation).

(b) X-Ray Diffraction Measurement (XRD)

The ground and polished sintered body for a target was directly measured under the following conditions.
Apparatus: Ultima-III, manufactured by Rigaku Corporation
X rays: Cu-Kα rays (wavelength: 1.5406 Å, monochromized by means of a graphite monochrometer)
2θ-θ reflection method, continuous scanning (1.0°/min)
Sampling interval: 0.02°
Slit DS, SS: 2/3°, RS: 0.6 mm The crystal structure of the compound was obtained by the X-ray diffraction measurement and the JCPDS card mentioned above.

(c) Relative Density

Relative density was measured by the following formula based on the theoretical density calculated from the density of the raw material powder and the density of the sintered body measured by the Archimedian method.

Relative density(%)=(Density measured by the Archimedian method)/(Theoretical density)×100

(d) Transverse Rupture Strength

The transverse rupture strength was measured by the three-point bending point test. The transverse rupture strength was evaluated by the three stages as follows.
78 MPa or more: A
68 MPa or more and less than 78 MPa: B
Less than 68 MPa: C (e) Average Crystal Size The sintered body was buried in a resin. The surface of the sintered body was polished using alumina particles (particle size: 0.05 μm), and observed using an X-ray microanalyzer (EPMA) ("JXA-8621 MX" manufactured by JEOL Ltd.) (magnification: ×5000). The maximum diameter of crystal particles observed on the surface of the sintered body within a square range of 30 μm×30 μm was measured. The maximum diameter thus measured was taken as the average crystal grain size.

The average crystal size in Example 1 was 3.9 μm. The average diameter of the aggregate of Ga atoms obtained by the area analysis of each element by EPMA was 2 μm or less.

(f) Composition of a Target

The composition of a target was analyzed by an ICP emission spectrometer (Shimadzu Corporation).

The results of evaluating the target are summarized in Table 1.

The area of the peak attributed to the homologous crystal structure represented by InGaO$_3$(ZnO) accounts for 99% or more of the total area of peaks. No peaks of crystals attributed to metal oxides other than InGaO$_3$(ZnO), e.g. compounds such as Ga$_2$O$_3$, ZnGa$_2$O$_4$, ZnO, In$_2$O$_3$, InGaO$_3$ and In$_2$O$_3$(ZnO)$_3$, were observed. No peaks were observed in the X-ray diffraction between 2θ=62.0 to 62.6 degrees.

The peak position was shifted to the lower angle side than the data No. 38-1104 of the JCPDS cards.

As a result of the observation of the area analysis map of the composition of In, Ga, Zn and O by EPMA, it was found that each element was uniformly dispersed.

(3) Film-Forming Properties

The film-forming properties of the resulting target were evaluated as follows. The results are shown in Table 1.

(a) In-Plane Thickness Distribution

A film was formed on a glass substrate having a dimension of 370×470 mm by sputtering by using the thus obtained target. The thicknesses at 20 locations were measured to obtain a thickness distribution. The thickness was measured by a surface shape measuring instrument by stylus (Dectak (Ulvac, Inc.)). The ratio of variation calculated by the following formula was evaluated as follows. 7% or less: A Exceeding 7%: B Ratio of variation(%)=(Maximum film thickness−Minimum film thickness)/(Average film thickness)×100

(b) Stability in Film-Forming Speed (Variation)

The film-forming speed before and after the 1000-hour continuous discharge (film formation) was compared.

The ratio of variation was evaluated as follows. Less than 5%: A 5% or more and less than 10%: B 10% or more: C The film-forming speed (sputtering rate) was obtained by dividing the thickness measured by a surface shape measuring instrument by stylus (Dectak ((Ulvac, Inc.)) by the film-forming time. The absolute value of the following formula was taken as the variation ratio of the film-forming rate.

Ratio of variation=(Film-forming speed before continuous discharge−film-forming speed after continuous discharge)/(Film-forming speed before continuous discharge)×100

(c) Sensitivity of Oxygen Partial Pressure

The sensitivity of oxygen partial pressure was judged from the results of the in-plane thickness distribution or the stability (variation) of the film-forming speed.

(d) Composition of a Thin Film

The composition was analyzed by an ICP emission spectrometer (Shimadzu Corporation). The composition ratio of the thin film was almost similar to that of the target (difference was ±1% in terms of atomic ratio).

(e) Others

The target after the 1000-hour continuous discharge (film formation) was visually observed. No nodules were found and no cracks occurred.

(4) Preparation of a Thin Film Transistor (TFT)

Figure 2:
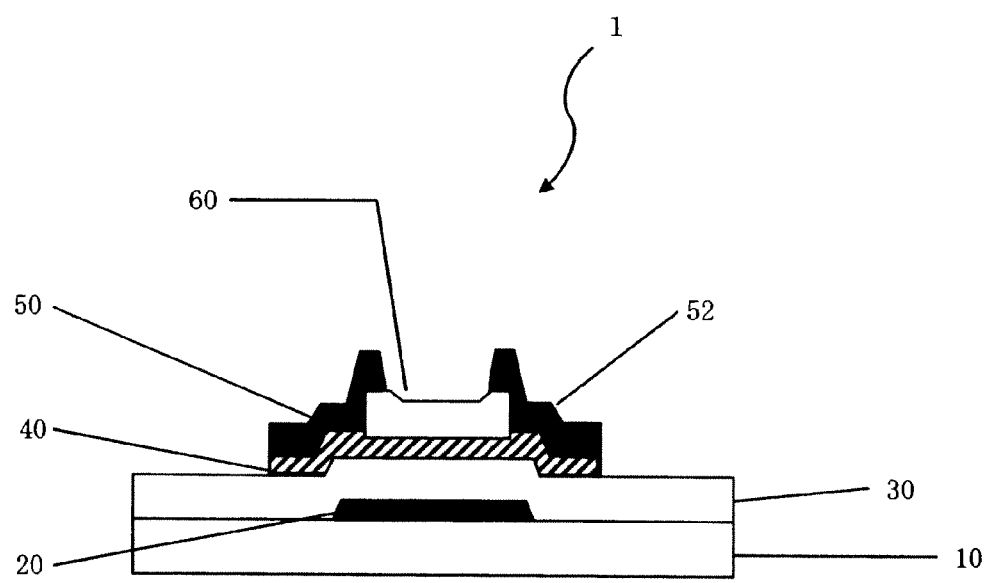
FIG. 2 is a view showing the structure of a channel-stopper type thin film transistor prepared in Example 1.

Using the sputtering target thus obtained, a channel stopper type thin film transistor (reverse staggered thin film transistor) according to FIG. 2 was prepared and evaluated.

As a glass substrate 10, a glass substrate (Corning 1737) was used. First, on the substrate 10, a 10 nm-thick Mo film, an 80 nm-thick Al film and a 10 nm-thick Mo film were sequentially stacked. By using the photolithographic method and the lift-off method, the stacked film was formed into a gate electrode 20.

On the gate electrode 20 and the substrate 10, a 200 nm-thick SiO$_2$ film was formed by the TEOS-CVD method, whereby a gate-insulating layer 30 was formed.

Subsequently, by the RF sputtering method, a 50 nm-thick semiconductor film 40 (channel layer) was formed by using the target prepared in (1) above. Thereafter, the film was subjected to a heat treatment in the atmosphere at 300° C. for 60 minutes.

On the semiconductor film 40, as an etch stopper layer 60 (protective film), an SiO$_2$ film was deposited.

In this example, input RF power was 100 W. The atmosphere at the time of film formation was 0.4 Pa (total pressure) and the gas flow ratio at this time was Ar:O$_2$=97:3. The substrate temperature is 50° C. The oxide semiconductor film 40 and the protective film 60 thus stacked were processed into an appropriate size by the photolithographic method and the etching method.

After the formation of the etch stopper layer 60, a 5 nm-thick Mo film, a 50 nm-thick Al film and a 5 nm-thick Mo film were sequentially stacked, and a source electrode 50 and a drain electrode 52 were formed by the photolithographic method and dry etching.

Thereafter, a heat treatment was conducted at 300° C. for 60 minutes in the atmosphere, whereby a transistor with a channel length of 20 μm and a channel width of 20 μm was produced.

(5) Evaluation of a TFT

The thin film transistor was evaluated as follows. The results are shown in Table 1.

(a) Mobility (Field Effect Mobility (μ)), S Value and Driving State

Mobility, S value and driving state were measured by means of a semiconductor parameter analyzer (4200, manufactured by Keithley Instruments, Inc.) at room temperature in a light-shielding environment.

As for the driving state, a thin film transistor with a positive Vth was assumed to be driven in the normally-off state, and a thin film transistor with a negative Vth was assumed to be driven in the normally-on state.

(b) Stability of TFT Properties (Variation)

A TFT was fabricated before and after 1000-hour continuous discharge (film formation), and variation in TFT properties was evaluated. A TFT which suffered from a variation of threshold voltage (Vth) of less than 1V was evaluated as A, and a TFT which suffered from a variation of threshold voltage (Vth) of 1V or more was evaluated as B.

Examples 2 to 13

Sintered bodies were prepared and evaluated in the same manner as in Example 1, except that the preparation was conducted with the composition and under the conditions shown in Table 1. The results are shown in Tables 1 and 2.

FIG. 3 shows the results of X-ray diffraction analysis of the sintered body obtained in Example 3. The lattice constant obtained by the X-ray diffraction was a=3.330 Å and c=26.506 Å.

In Examples 2 to 13, the area of a peak attributed to a homologous crystal structure represented by $InGaO_3(ZnO)$ accounted for 99% or more of the total peak area. Peaks of crystals attributed to compounds represented by $Ga_2O_3$, $ZnGa_2O_4$, $ZnO$, $In_2O_3$, $InGaO_3$ and $In_2O_3(ZnO)_3$ were not observed. In the X-ray diffraction, no peaks were observed at 2θ=62.0 to 62.6 degrees.

The composition ratio of the thin film prepared by sputtering in Examples 2 to 13 was almost the same as that of the target (difference was ±1% in terms of atomic ratio).

Comparative Examples 1 to 4

Sintered bodies were prepared and evaluated in the same manner as in Example 1, except that the preparation was conducted with the composition and under the conditions shown in Table 1. The results are shown in Table 3.

In Comparative Examples 2 to 4, in the X-ray diffraction, between 2θ=62.0 to 63 degrees, a peak of which the intensity was exceeding 3% of the peak intensity of the maximum peak of $InGaO_3(ZnO)$ (normally, 2θ=around 30.8 degree) was confirmed.

TABLE 1

| | | | Examples | | | | | | | | | |
|---|---|---|---|---|---|---|---|---|---|---|---|---|
| | | | 1 | 2 | 3 | 4 | 5 | 6 | 7 | 8 | 9 | 10 |
| Target | Composition ratio of target (atomic ratio) | In/(In + Ga + Zn) | 0.45 | 0.45 | 0.45 | 0.43 | 0.46 | 0.44 | 0.46 | 0.45 | 0.45 | 0.47 |
| | | Ga/(In + Ga + Zn) | 0.2 | 0.2 | 0.2 | 0.22 | 0.19 | 0.2 | 0.2 | 0.19 | 0.21 | 0.2 |
| | | Zn/(In + Ga + Zn) | 0.35 | 0.35 | 0.35 | 0.35 | 0.35 | 0.36 | 0.34 | 0.36 | 0.34 | 0.33 |
| | | In/(In + Ga) | 0.69 | 0.69 | 0.69 | 0.66 | 0.71 | 0.69 | 0.7 | 0.7 | 0.68 | 0.7 |
| Preparation of target | Mixing method | | Ball mill | Ball mill | Ball mill | Ball mill | Ball mill | Ball mill | Ball mill | Ball mill | Ball mill | Ball mill |
| | Granulation method | | Natural drying | Natural drying | Natural drying | Natural drying | Natural drying | Natural drying | Natural drying | Natural drying | Natural drying | Natural drying |
| | Shaping method | | CIP | CIP | CIP | CIP | CIP | CIP | CIP | CIP | CIP | CIP |
| | Sintering conditions | Sintering atmosphere | Oxygen | Air | Air | Oxygen | Oxygen | Oxygen | Oxygen | Oxygen | Oxygen | Oxygen |
| | | Heating rate (° C./min) Room temp. to 400° C. | 1 | 0.9 | 0.9 | 1 | 1 | 1 | 1 | 1 | 1 | 1 |
| | | 400° C. to 1000° C. | 1 | 2.5 | 2.5 | 1 | 1 | 1 | 1 | 1 | 1 | 1 |
| | | 1000° C. to sintering temp. | 1 | 4.5 | 4.5 | 1 | 1 | 1 | 1 | 1 | 1 | 1 |
| | | Sintering temperature (° C.) | 1500 | 1500 | 1400 | 1500 | 1500 | 1500 | 1500 | 1500 | 1500 | 1500 |
| | | Sintering time (Hr) | 12 | 20 | 20 | 12 | 12 | 12 | 12 | 12 | 12 | 12 |
| | Grinding | Thickness before grinding (mm) | 9 | 6 | 6 | 9 | 9 | 9 | 9 | 9 | 9 | 9 |
| | | Thickness after grinding (mm) | 5 | 5 | 5 | 5 | 5 | 5 | 5 | 5 | 5 | 5 |

TABLE 1-continued

|  |  | Examples | | | | | | | | | |
|---|---|---|---|---|---|---|---|---|---|---|---|
|  |  | 1 | 2 | 3 | 4 | 5 | 6 | 7 | 8 | 9 | 10 |
|  | Depth of a part removed from the surface (mm) | 2 | 0.5 | 0.5 | 2 | 2 | 2 | 2 | 2 | 2 | 2 |
|  |  | Grinding back and front | Grinding back and front | Grinding back and front | Grinding back and front | Grinding back and front | Grinding back and front | Grinding back and front | Grinding back and front | Grinding back and front | Grinding back and front |
|  | Reduction treatment (Heat treatment for 2 hours at 880° C. in an argon atmosphere) | None | None | None | None | None | None | None | None | None | None |
| Evaluation of target | Crystal form of target — InGaO$_3$(ZnO) | ○ | ○ | ○ | ○ | ○ | ○ | ○ | ○ | ○ | ○ |
|  | Crystal form of target — Other than InGaO$_3$(ZnO) | — | — | — | — | — | — | — | — | — | — |
|  | Specific resistance (mΩcm) | 4.4 | 6.3 | 7.2 | 4.9 | 3.8 | 4.6 | 4.6 | 3.9 | 4.7 | 4.6 |
|  | Relative density (%) | 97 | 95 | 94 | 96 | 97 | 97 | 97 | 97 | 97 | 97 |
|  | Transverse rupture strength | A | A | A | A | A | A | A | A | A | A |
| Film-forming properties of target | In-plane film thickness distribution | A | A | A | A | A | A | A | A | A | A |
|  | Stability of film-forming speed (variation) | A | A | A | A | A | A | A | A | A | A |
|  | Sensitivity to oxygen partial pressure | Adequate | Adequate | Adequate | Adequate | Adequate | Adequate | Adequate | Adequate | Adequate | Adequate |
| Evaluation of TFT | Mobility (cm$^2$/Vs) | 14 | 14 | 14 | 13 | 14 | 14 | 14 | 14 | 13 | 14 |
|  | S value (V/decade) | 0.2 | 0.2 | 0.2 | 0.2 | 0.2 | 0.2 | 0.2 | 0.2 | 0.2 | 0.2 |
|  | Driving state | Normally off | Normally off | Normally off | Normally off | Normally off | Normally off | Normally off | Normally off | Normally off | Normally off |
|  | Stability of TFT properties (variation) | A | A | A | A | A | A | A | A | A | A |

TABLE 2

|  |  |  | Examples | | |
|---|---|---|---|---|---|
|  |  |  | 11 | 12 | 13 |
| Target | Composition ratio (atomic ratio) | In/(In + Ga + Zn) | 0.44 | 0.4 | 0.4 |
|  |  | Ga/(In + Ga + Zn) | 0.23 | 0.27 | 0.25 |
|  |  | Zn/(In + Ga + Zn) | 0.33 | 0.33 | 0.35 |
|  |  | In/(In + Ga) | 0.66 | 0.6 | 0.62 |
| Preparation of target | Mixing method |  | Ball mill | Ball mill | Ball mill |
|  | Granulation method |  | Natural drying | Natural drying | Natural drying |
|  | Shaping method |  | CIP | CIP | CIP |
|  | Sintering conditions | Sintering atmosphere | Oxygen | Oxygen | Oxygen |
|  |  | Heating rate (° C./min) Room temperature to 400° C. | 1 | 1 | 1 |
|  |  | 400° C. to 1000° C. | 1 | 1 | 1 |
|  |  | 1000° C. to sintering temperature | 1 | 1 | 1 |
|  |  | Sintering temperature (° C.) | 1500 | 1500 | 1500 |
|  |  | Sintering time (Hr) | 12 | 12 | 12 |
|  | Grinding | Thickness before grinding (mm) | 9 | 9 | 9 |
|  |  | Thickness after grinding (mm) | 5 | 5 | 5 |
|  |  | Depth of a part removal from the surface (mm) | 2 | 2 | 2 |
|  |  |  | Grinding back and front | Grinding back and front | Grinding back and front |
|  | Reduction treatment (2 hour-heat treatment in an argon atmosphere at 880° C.) |  | None | None | None |

TABLE 2-continued

|  |  |  | Examples | | |
|---|---|---|---|---|---|
|  |  |  | 11 | 12 | 13 |
| Evaluation of target | Crystal form of target | InGaO$_3$(ZnO) | ○ | ○ | ○ |
|  |  | Other than InGaO$_3$(ZnO) | — | — | — |
|  | Specific resistance (mΩcm) |  | 5.1 | 8.2 | 7.8 |
|  | Relative density (%) |  | 96 | 94 | 95 |
|  | Transverse rupture strength |  | A | A | A |
| Film-forming properties of target | In-plane film thickness distribution |  | A | A | A |
|  | Stability of film-forming speed (variation) |  | A | A | A |
|  | Sensitivity to oxygen partial pressure |  | Adequate | Adequate | Adequate |
| Evaluation of TFT | Mobility (cm$^2$/Vs) |  | 13 | 11 | 12 |
|  | S value (V/decade) |  | 0.2 | 0.2 | 0.2 |
|  | Driving state |  | Normally off | Normally off | Normally off |
|  | Stability of TFT properties (variation) |  | A | A | A |

TABLE 3

|  |  |  | Com. Examples | | | |
|---|---|---|---|---|---|---|
|  |  |  | 1 | 2 | 3 | 4 |
| Target | Composition ratio of target (atomic ratio) | In/(In + Ga + Zn) | 0.33 | 0.34 | 0.25 | 0.30 |
|  |  | Ga/(In + Ga + Zn) | 0.33 | 0.34 | 0.25 | 0.20 |
|  |  | Zn/(In + Ga + Zn) | 0.34 | 0.32 | 0.50 | 0.50 |
|  |  | In/(In + Ga) | 0.50 | 0.50 | 0.50 | 0.60 |
| Production of target | Mixing method |  | Ball mil | Ball mil | Ball mil | Ball mil |
|  | Granulating method |  | Natural drying | Spray dryer | Natural drying | Natural drying |
|  | Shaping method |  | CIP | CIP | CIP | CIP |
|  | Sintering conditions | Sintering atmosphere | Oxygen | Atmosphere | Oxygen | Oxygen |
|  |  | Heating rate (° C./min) Room temperature to 400° C. | 1.0 | 0.9 | 1.0 | 1.0 |
|  |  | 400° C. to 1000° C. | 1.0 | 2.5 | 1.0 | 1.0 |
|  |  | 1000° C. to sintering temperature | 1.0 | 4.5 | 1.0 | 1.0 |
|  |  | Sintering temperature (° C.) | 1500 | 1500 | 1500 | 1500 |
|  |  | Sintering time (Hr) | 12 | 20 | 12 | 12 |
|  | Grinding | Thickness before grinding (mm) | 9.0 | 5.2 | 9.0 | 9.0 |
|  |  | Thickness after grinding (mm) | 5.0 | 5.0 | 5.0 | 5.0 |
|  |  | Depth of a part removed from the surface (mm) | 2.0 | 0.1 | 2.0 | 2.0 |
|  |  |  | Grinding back and front | Grinding back and front | Grinding back and front | Grinding back and front |
|  | Reduction treatment (2 hour-heat treatment in an argon atmosphere at 880° C.) |  | None | None | None | None |
| Evaluation of target | Crystal form of target | InGaO$_3$(ZnO) | ○ | ○ | — | ○ |
|  |  | Other than InGaO$_3$(ZnO) | — | ○ | ○ | ○ |
|  | Specific resistance (mΩcm) |  | 23 | 18 | 34 | 32 |
|  | Relative density (%) |  | 93 | 93 | 91 | 92 |
|  | Transverse rupture strength |  | A | B | B | C |
| Film-forming properties of target | In-plane thickness distribution |  | B | B | B | B |
|  | Stability of film-forming speed (variation) |  | B | B | B | A |
|  | Sensitivity to oxygen partial pressure |  | Sensitive | Sensitive | Sensitive | Sensitive |
| Evaluation of target | Mobility (cm$^2$/Vs) |  | 8 | 8 | 6 | 6 |
|  | S value (V/decade) |  | 0.5 | 0.5 | 0.5 | 0.4 |
|  | Driving state |  | Normally off | Normally off | Normally off | Normally off |
|  | Stability of TFT properties (variation) |  | B | B | B | B |

INDUSTRIAL APPLICABILITY

The sputtering target of the invention can be used for the production of a thin film transistor or the like. Further, the thin film transistor of the invention can be used in an integrated circuit or the like.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. A sintered body comprising an oxide that comprises In, Ga and Zn at the following atomic ratio and comprises as a main component a compound having as a main component a homologous crystal structure represented by $InGaO_3(ZnO)$:

$$0.28 \leq Zn/(In+Zn+Ga) \leq 0.38$$

$$0.18 \leq Ga/(In+Zn+Ga) \leq 0.28,$$

wherein the sintered body has a relative density of 90% or more, a specific resistance of 15 mΩcm or less, a surface roughness of 2 μm or less and an average crystal diameter of 10 μm or less.

2. The sintered body according to claim 1, wherein crystals of compounds represented by $Ga_2O_3$, $ZnGa_2O_4$, $ZnO$, $In_2O_3$, $InGaO_3$ and $In_2O_3(ZnO)_3$ are not observed in an analysis by X-ray diffraction.

3. The sintered body according to claim 1, wherein the atomic ratio of In, Ga and Zn of the oxide further satisfies the following formula:

$$0.59 \leq In/(In+Ga).$$

4. The sintered body according to claim 1, wherein the oxide consists essentially of In, Ga, Zn and O.

5. A sputtering target comprising the sintered body according to claim 1, which has a relative density of 90% or more, a specific resistance of 15 mΩcm or less, a surface roughness of 2 μm or less and an average crystal diameter of 10 μm or less.

6. A method for producing a thin film transistor comprising the step of forming a semiconductor layer using the sputtering target according to claim 5.

7. A thin film transistor prepared by using the sputtering target according to claim 5.

8. The sputtering target according to claim 5, which has a transverse rupture strength of 58 MPa or more.

9. The sintered body according to claim 1, which has a transverse rupture strength of 58 MPa or more.

* * * * *